United States Patent [19]

Bober

[11] Patent Number: 5,243,324
[45] Date of Patent: Sep. 7, 1993

[54] METHOD OF DETECTING A FAULT IN AN AUTOMOTIVE SYSTEM

[75] Inventor: Gregory D. Bober, Grosse Points Woods, Mich.

[73] Assignee: Ford Motor Company, Dearborn, Mich.

[21] Appl. No.: 789,205

[22] Filed: Nov. 7, 1991

[51] Int. Cl.$^5$ .............................................. B60Q 1/00
[52] U.S. Cl. .................... 340/439; 340/636; 364/424.04; 364/187; 280/735; 307/10.7; 324/429
[58] Field of Search .............................. 340/439, 636; 364/424.03, 424.04, 424.05, 184, 186, 187; 180/271, 232; 280/728, 734, 735; 307/10.1, 10.7; 324/427, 428, 429

[56] References Cited

U.S. PATENT DOCUMENTS

| | | |
|---|---|---|
| 4,016,408 | 4/1977 | Koetzle . |
| 4,082,218 | 4/1978 | Paulinski . |
| 4,307,389 | 12/1981 | Stotkowski . |
| 4,399,538 | 8/1983 | Cholakian et al. . |
| 4,461,003 | 7/1984 | Tamaki . |
| 4,503,479 | 3/1985 | Otsuka et al. . |
| 4,550,286 | 10/1985 | Holland et al. . |
| 4,621,833 | 11/1986 | Soltis . |
| 4,661,910 | 8/1987 | Reinecke et al. ............... 364/424.03 |
| 4,673,912 | 6/1987 | Kumasaki et al. . |
| 4,780,826 | 10/1988 | Nakano et al. . |
| 4,805,923 | 2/1989 | Soltis . |
| 4,903,208 | 2/1990 | Murai . |
| 4,943,777 | 7/1990 | Nakamura et al. ................ 340/636 |
| 4,999,775 | 3/1991 | Muraoka ......................... 364/424.03 |
| 5,010,487 | 4/1991 | Stonebocker .................. 364/424.03 |
| 5,055,825 | 10/1991 | Yang ............................... 364/424.03 |
| 5,107,094 | 8/1992 | Kuhn et al. ......................... 307/10.7 |
| 5,129,713 | 7/1992 | Matsuda ........................... 340/636 |

Primary Examiner—Jin F. Ng
Assistant Examiner—Nina Tong
Attorney, Agent, or Firm—Raymond L. Coppiellie; Clifford L. Sadler

[57] ABSTRACT

A method for detecting a fault in an automotive system is disclosed, the method including the steps of energizing the system, monitoring the power supply value of the vehicle power supply during a predetermined interval; detecting an inability of the system to be placed into a desired operating state and generating a fault signal in response thereto; and recording each occurrence of a fault signal only when the power supply value is within predetermined limits.

7 Claims, 3 Drawing Sheets

METHOD OF DETECTING A FAULT IN AN AUTOMOTIVE SYSTEM

BACKGROUND OF THE INVENTION

1. Field of the Invention

The present invention relates to a method for detecting an electrical fault in an automotive system. More particularly, the present invention relates to a method of detecting an electrical fault in an automotive system, the method accounting for voltage transients which may occur in the system.

2. Disclosure Information

Many systems within an automotive vehicle function between two or more operating states. An example of one such system is a suspension system having multistable suspension units. Suspension units defined as "multistable" can be operated in a plurality of predetermined states. Such suspension units provide control of vehicle ride and handling which may be tailored to particular road surfaces and/or driver characteristics. In typical fashion, a particular state chosen for the suspension unit is determined by a control algorithm with inputs from a variety of vehicle parameters. For example, it is known to control a multistable suspension unit by utilizing vehicle linear acceleration, braking, steering activity, and vehicle speed as well as through a manually operable mode switch. U.S. Pat. No. 4,621,833, assigned to the assignee of the present invention, discloses a system for operating multistable suspension units, including feedback of the operating mode of each suspension unit. Other systems within the vehicle, such as climate control, braking, engine, and various body electronics also function between two or more operating states and are suitable for use with the method of the present invention in detecting a fault within such system.

Typically in these types of systems, an actuator such as a motor, a solenoid, relays and the like associated with a switching device place the system into a desired operating state. If the actuator fails to place the system into the desired state, the system may generate an error message and simply shut down until serviced. The error messages may be generated even though there is no actual fault within the system, the error message being generated because of an electrical transient, such as a voltage transient present within the system. Various methods and systems have been proposed for detecting faults within automotive systems, such as are shown in U.S. Pat. Nos. 4,082,218; 4,780,826 and 4,550,286. However, none of these patents teach or suggest any system which discounts a fault signal when the vehicle power supply is outside of predetermined limits, thus negating the fault signal due to electrical or voltage transients.

Other systems have been proposed for detecting power supply voltage transients or conditions that can disable the controlling central processing unit (CPU) such as are shown in U.S. Pat. Nos. 4,016,408; 4,307,389; 4,399,538; 4,461,003; 4,503,479; 4,673,912; and 4,903,208. In these patents, the CPU is disabled when an abnormal voltage transient is detected even though the sensors and controlling systems may have been functioning properly before the voltage transient was detected. The patents do not teach that during the time interval when the actual voltage transient began and when it is detected, the control system may have already been operating erratically and that the input sensing methods may have been providing faulty data signals. Therefore, it would be desirable to have a system wherein the input data recorded prior to the detected voltage transient or undesirable voltage condition would be ignored or treated as inaccurate prior to the generated fault signal.

These and other advantages of the present invention will become apparent from the following summary, detailed description in claims which follow.

SUMMARY OF THE INVENTION

There is disclosed herein a method for detecting a fault in an automotive system having a power supply and including counter means for recording each occurrence of a fault in the system, the method comprising the steps of: electrically energizing the system; monitoring a power supply value of the vehicle power supply during a predetermined time interval; and detecting an inability of the system to be placed into a desired operating state and generating a fault signal in response thereto. The method further comprises the steps of: recording each occurrence of the fault signal in the counter means only when the power supply value is within predetermined limits; repeating the above steps until a number of occurrences of the fault signals exceeds a predetermined number; and providing a human detectable fault signal indication when the number of fault occurrences exceeds a predetermined number and a predetermined time interval. In one embodiment of the present invention, the method further includes the steps of: resetting the counter means to a predetermined value when the power supply value is outside of the predetermined limits.

DESCRIPTION OF THE PREFERRED EMBODIMENT

Figure 1:
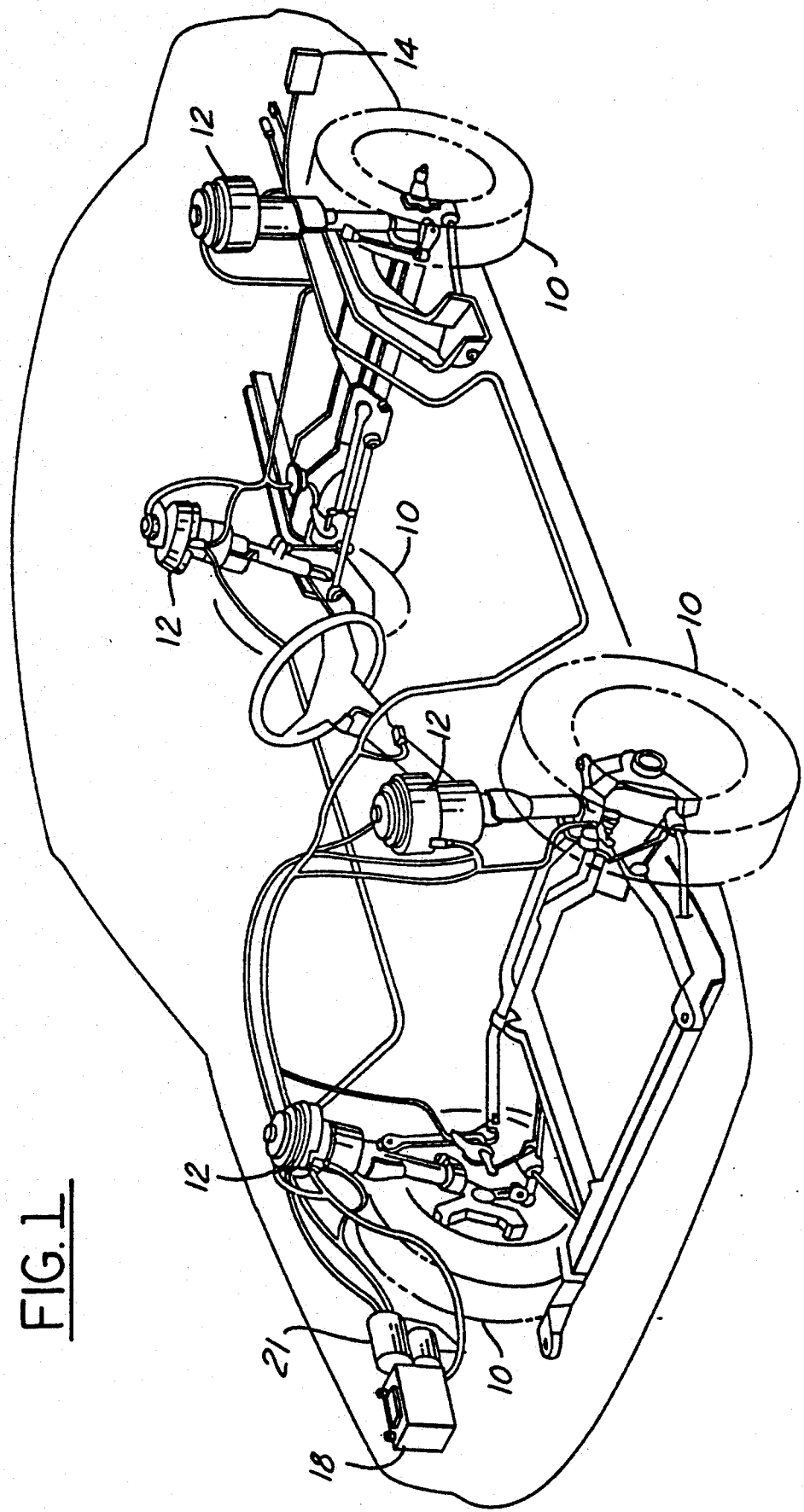
FIG. 1 is a prospective drawing of a motor vehicle incorporating a system according to the present invention. The figure shows various components of a system which could employ the method of the present invention.

As shown in FIG. 1, a control system according to the present invention is intended for use with adjustable suspension units typically found in automotive vehicles. U.S. Pat. Nos. 4,313,529; 4,621,833; 4,666,180; and 4,805,923, which are hereby incorporated by reference, disclose adjustable suspension units which are exemplary of but a portion of the suspension units which may be controlled by a method according to the Present invention. However, it will be apparent to those skilled in the art that the method of fault detection of the present invention can be used in any automotive system having at least two operating states, such as an ABS system, a traction, a control system, a climate control system, an engine diagnostic system, body electronics systems typically employed in such devices as door and seat functions or any system that has intelligent control or monitoring of the diagnostics of the system. The types of faults that a system control module may encounter are commonly known to those skilled in the art, such as when the output drive or terminal is shorted in the electrical system to the positive terminal of the battery or to the electrical negative terminal of the battery. An overcurrent condition occurs when the output device is drawing too much current wherein an undercurrent condition exists when the output device is not drawing enough current. Furthermore, a fault may be generated when the output device is disconnected from the power supply or the control module. FIG. 1 shows one type of such system.

The motor vehicle in FIG. 1 is equipped in conventional fashion with adjustable air spring suspension units 12, which serve to control the vertical motion of the wheel and tire assemblies 10. The air springs are supplied with compressed air by compressor 21 which is electrically powered by the vehicle's battery 18. Each of the adjustable suspension units is operatively connected with and controlled by suspension control module 14. The control module includes a microprocessor and may be arranged according to a number of different architectures. Those skilled in the art will appreciate in view of this disclosure that each such architecture could generally include an input-output control circuit (I/O) for exchanging data with external devices and a random access memory (RAM) for temporarily holding data while the data are being processed. Control programs including unit commands will be sequentially read from a read-only memory (ROM). Unit commands will be executed by a central processing unit (CPU). Those skilled in the art will further appreciate a view of this disclosure that the system shown in FIG. 1 represents merely one preferred embodiment of the present invention, it being understood that the method of the present invention is suitable for use with other suspension units such as air/hydraulic or hydraulic load bearing units or combination of adjustable load bearing and adjustable damping units such as those known in the art.

In FIG. 1, the system is operated by the suspension control module 14 which receives inputs from each of the suspension units 12 as well as inputs from various vehicle sensors. According to the needs of the vehicle being considered for a system, the vehicle sensors could include a steering sensor, a brake sensor, speed sensor, suspension position sensor, manual mode selection switch or other type of sensing devices. As shown schematically in FIG. 2, each of these sensor devices provide the system control module 14 with control inputs as represented by block 20.

Figure 3:
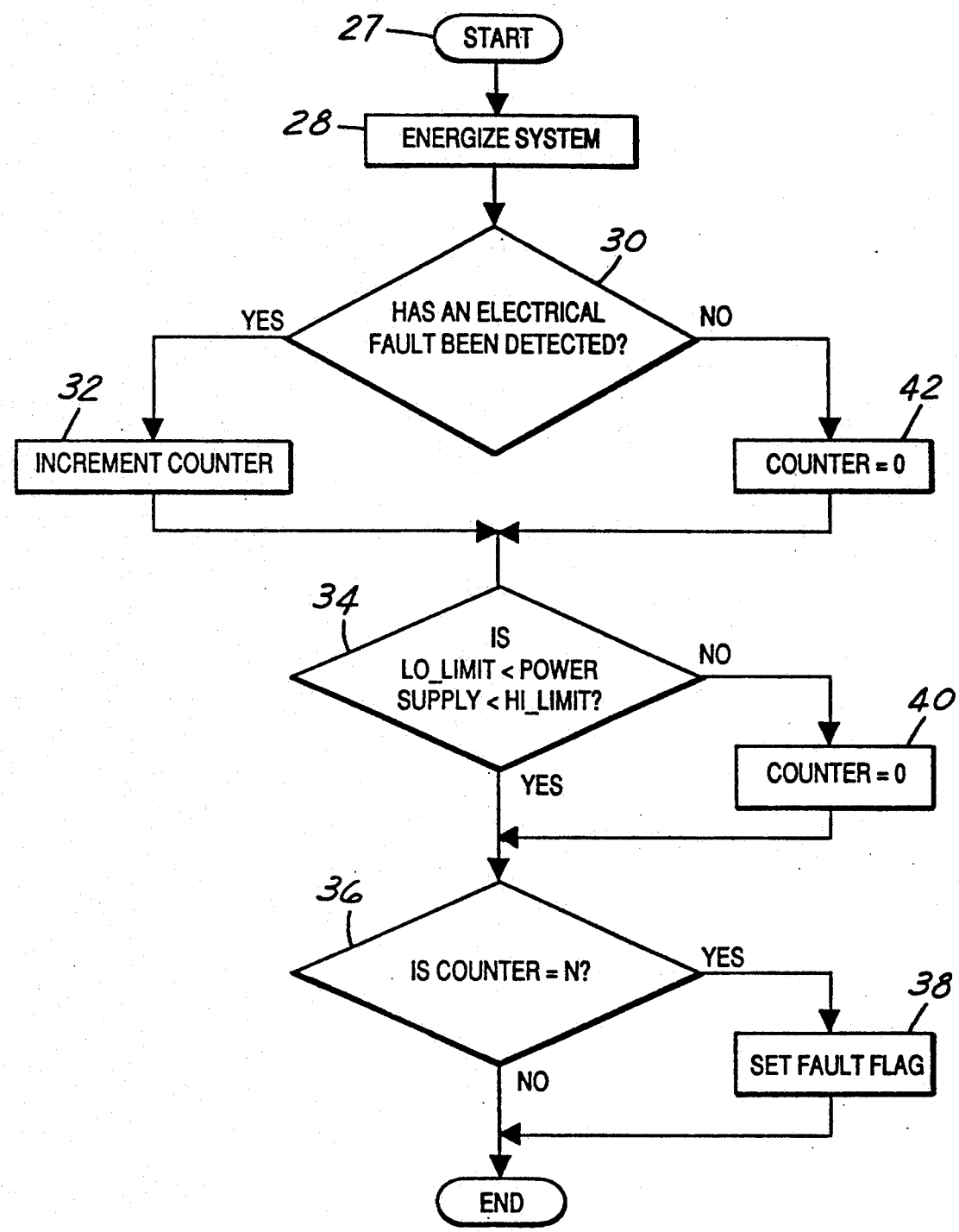
FIG. 3 is a logic flow block diagram corresponding to the method of the present invention.
Figure 2:
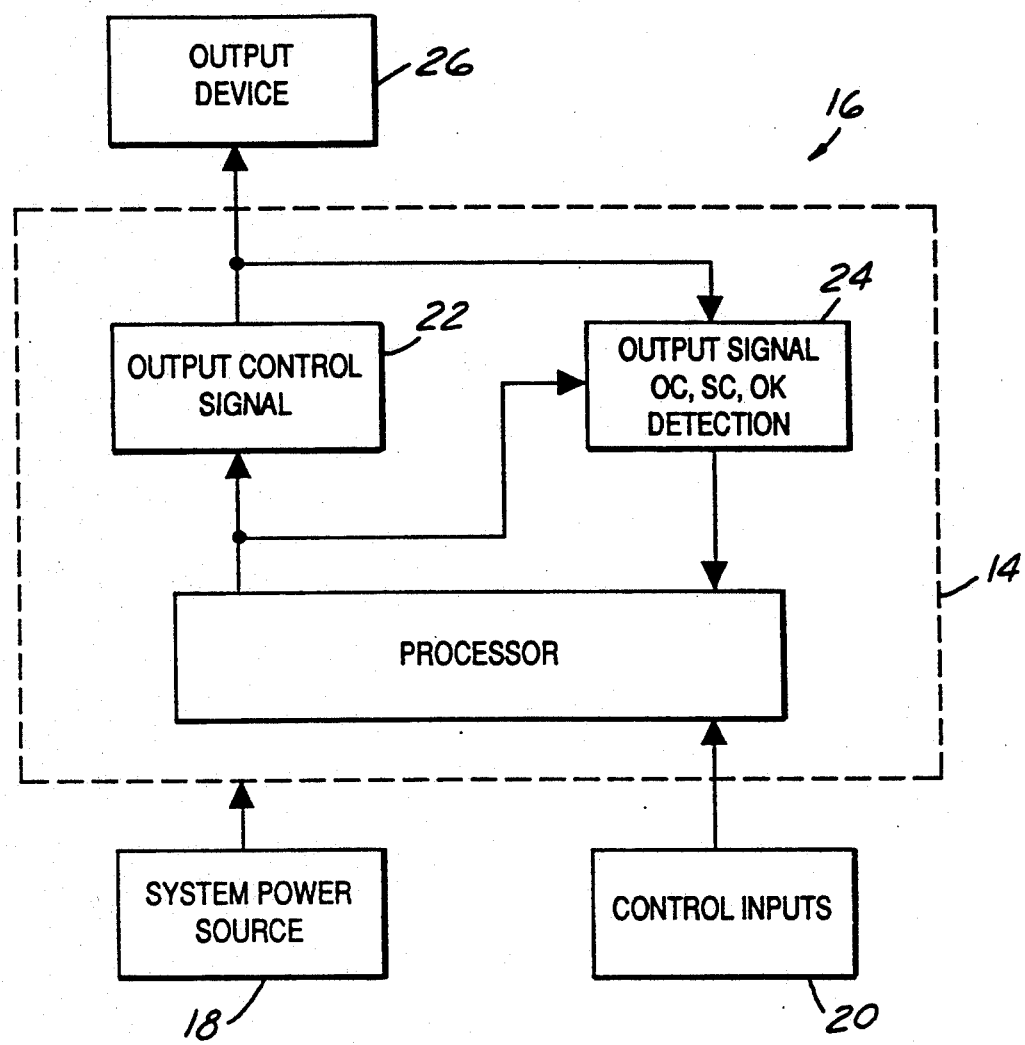
FIG. 2 is a schematic representation of an automatic system which can be operated according to the method of the present invention.

FIG. 2 represents a block diagram of a typical automotive system which could employ a method of the present invention to detect faults within the system. As shown in FIG. 2, the system power source 18, such as the vehicle battery or an alternator, powers the system control module 14. Control inputs 20, such as described above, generate signals which are fed to a central processing unit 21 such as described above. The processor 21 interprets the data and determines the action for the system to take, and outputs a control signal, block 22, which is ultimately sent to an output device 26 such as the suspension actuators 12 shown in FIG. 1. Other output devices could be relays, motors, solenoids, light bulbs or any other device which is actuatable between at least two operating states. After generating the output control signal, the signal is checked at block 24 to determine whether an open circuit (OC), a short circuit (SC), or an acceptable (OK) condition exists. Block 24 essentially determines whether a fault exists within the system and may be determined in any of a number of known ways such as those disclosed in the references cited in the background section of this application. Operation of the method of the present invention will now be explained with reference to FIG. 3. Beginning at the start block 27 as shown in FIG. 3, the method of the Present invention for detecting a fault in an automotive system first includes the step shown in block 28 wherein the system is electrically energized. After energizing the system at block 28, the processor determines whether an electrical fault has been detected as shown in block 30. It should be apparent to those skilled in the art that there are many known ways for a processor to detect when an electrical fault has been detected, such as a voltage or current feedback system or a switch closure mechanism. Proceeding to the left side of block 30, if an electrical fault has been detected, at block 32 a counter associated with the processor is incremented by one.

At block 34, the processor determines whether a power supply value, such as battery voltage, is between predetermined threshold values, designated by "LO Limit" and "HI Limit". These limits of battery voltage can range from between five and 24 volts, and in the preferred embodiment the predetermined limits are 11 volts for the low limit and 16 volts for the high limit. If the power supply is within the predetermined limits, the method proceeds to block 36 wherein the processor determines whether the counter has reached a predetermined value, N. If the counter does not equal N, the method of the present invention begins again at decision block 30. However, if the counter has reached the threshold value, N, the fault flag is set as shown in block 38. This fault flag can be set in a number of known ways, such as through an indication lamp on the interior of the vehicle or by registering the fault flag occurrence in the memory of the microprocessor so that upon a diagnostic inspection of the control module of the system, an operator or technician is able to attain that the fault flag has been set a specific number of times. This corresponds to the step of providing a human detectable fault signal indication where the number of default occurrences exceeds the predetermined number in the method of the present invention.

Returning to decision block 34, if the power supply value is outside of the threshold limits, the method of the present invention proceeds to block 40 wherein the counter is reset to a predetermined value, commonly zero. The counter is set to zero under the assumption that any prior values generated by the processor in determining whether a fault has been detected may have been caused by a voltage transient. The method of the present invention allows the processor to maintain operation in the presence of voltage transients so that the vehicle system does not unnecessarily shut down or cause a fault signal indication to be generated when the control or data input values may have been altered by the voltage transient to give a false indication of an electrical fault when in actuality no fault has been generated within the system.

Figure 4:
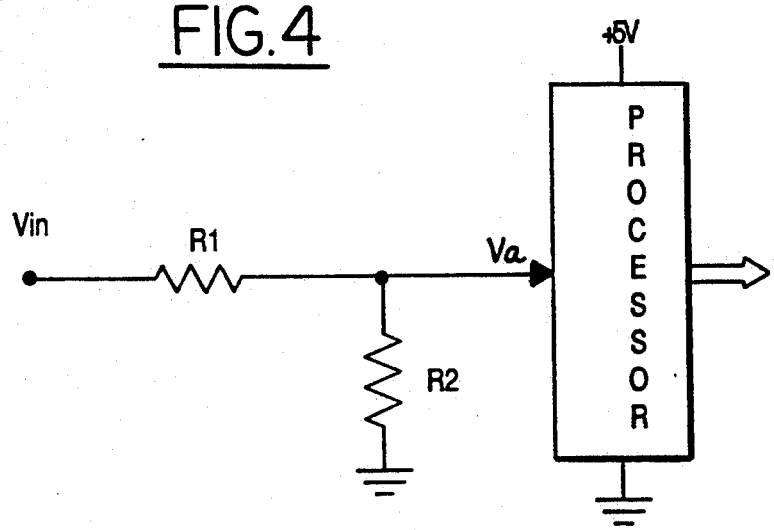
FIG. 4 is an electrical schematic diagram of a circuit utilized by the method of the present invention to determine when the vehicle power supply values are within predetermined limits.

FIG. 4 shows a simple electrical schematic diagram of a circuit for determining whether the power supply value, such as battery voltage, is within prescribed limits. As shown in FIG. 4, a voltage, $V_{in}$ flows into a processor after passing through resistors $R_1$ and $R_2$ which reduce $V_{in}$ to a voltage $V_a$. $V_a$ is equal to:

$$V_{in}\left(\frac{R_2}{R_2 + R_1}\right)$$

This simply reduces the voltage value being fed into the processor. At the processor, the voltage value, $V_a$ is fed into an analog-to-digital converter wherein the voltage value is converted to a value to be compared to a predetermined set of reference values which define the low limit and high limit as shown in block 34, FIG. 3. The processor then compares the generated value to the stored values to determine whether the power supply value is within the prescribed limits. It should be apparent to one of ordinary skill in the art that various other types of circuits are known for determining whether a power supply value is within prescribed limits, and then the circuit shown in FIG. 4 is a very simple schematic of only one such circuit. Furthermore, it is important to note that the method of the present invention performs the test of whether the power supply value is within the predetermined limits at a slower rate than it does for performing the other steps within the method of the present invention. This will be discussed below.

Returning now to FIG. 3, to finish the method of the present invention. If, at block 30, an electrical fault was not detected within the system, the counter of the processor is reset to zero, block 42. In the method shown in FIG. 3, as long as the power supply values are within the prescribed limits as set forth above, the algorithm will continue to run and either increment or reset the counter until the counter reaches a predetermined value within a predetermined time period at which time the fault flag is set. The steps of the algorithm shown in FIG. 3 and denoted by blocks 30, 32, 36, 38, and 42 are performed by the processor approximately every 6–10 milliseconds. The steps of determining whether the voltage is within the predetermined limits is performed by the system approximately every 60–70 milliseconds. Because of this discrepancy, it is necessary to set the value of N large enough to allow at least one execution of the power supply value routine shown in block 34 so that an electrical fault signal is not generated resulting solely from voltage transients. For example, if the routine of block 34 is set to occur every 60 milliseconds, and the electrical fault detection routine occurs every six milliseconds, then the value of N at decision block 20 should be set to a value larger than ten so that at least once during execution of the electrical fault detection routine, a check of the vehicle voltage value is made to insure that the electrical fault detections are not occurring solely due to voltage transients within the system. This represents an improvement to the many prior art electrical detection methods, none of which shows the use of a voltage determination routine as described in the method of the present invention. In many of the prior art systems, a voltage transient could often last long enough to allow a fault flag to be set even though the fault may be due solely to voltage transients. By incorporating a step of recording the occurrence of a fault in a counter only when the power supply value is within the predetermined limits, inadvertent setting of a fault indication device is decreased substantially.

Various modifications and variations will no doubt occur to those skilled in the art to which this invention pertains. For example, and as stated above, various electrical circuitry can be employed in the method of the present invention to perform the subroutines of the present invention. Furthermore, various other time constants can be used as well. The present invention also may also decrement the counters at blocks 40 and 42 instead of resetting the counters to zero. These and all other variations which rely upon the teachings by which this disclosure has advanced the art are properly considered within the scope of this invention as defined by the appended claims.

What is claimed is:

1. A method for detecting a fault in an automotive system having a power supply and including counter means for recording each occurrence of a fault in said system, said method comprising the steps of:
   a. electrically energizing said system;
   b. monitoring a power supply value of said vehicle power supply during a predetermined time interval;
   c. detecting an inability of said system to be placed into a desired operating state and generating a fault signal in response thereto;
   d. recording each occurrence of said fault signal in said counter means only when said power supply value is within predetermined limits;
   e. repeating the above steps until the number of occurrences of said fault signals exceeds a predetermined number; and
   f. providing a human detectable fault signal indication when the number of fault occurrences exceeds said predetermined number in said predetermined time interval.

2. The method according to claim 1, further including the step of ignoring said fault signal if said power supply value is outside of said predetermined limits.

3. The method according to claim 1, further including the step of resetting said counter means to a predetermined value when said power supply value is outside of said predetermined limits.

4. The method according to claim 1, wherein said vehicle power supply is a battery and said power supply value is voltage of said battery.

5. The method according to claim 4, wherein said predetermined limits of said battery voltage are between 5 and 24 volts.

6. A method for detecting a fault in an automotive system having a battery outputting a voltage, said system having at least two operating states and including counter means for recording each occurrence of a fault in said system, said method comprising the steps of:
   a. electrically energizing said system;
   b. monitoring said battery voltage during a predetermined time interval;
   c. detecting an inability of said system to be placed into a desired operating state and generating a fault signal in response thereto;
   d. recording each occurrence of said fault signal in said counter means only when said battery voltage is between 11 and 16 volts;
   e. resetting said counter means to zero when said battery voltage is not between 11 and 16 volts;
   f. repeating the above steps until the number of occurrences of said fault signals exceeds a predetermined number; and
   g. providing a human detectable fault signal indication when the number of fault occurrences exceeds said predetermined number in said predetermined time interval.

7. A method for detecting a fault in an automotive system having a power supply and including counter means for recording each occurrence of a fault in said system, said method comprising the steps of:

a. electrically energizing said system;
   b. monitoring a power supply value of said vehicle power supply during a predetermined time interval;
   c. detecting an inability of said system to be placed into a desired operating state and generating a fault signal in response thereto;
   d. recording each occurrence of said fault signal in said counter means only when said power supply value is within predetermined limits;
   e. ignoring said fault signal if said power supply value is outside of said predetermined limits;
   f. resetting said counter means to a predetermined value when said power supply value is outside of said predetermined limits;
   g. repeating the above steps until the number of occurrences of said fault signals exceeds a predetermined number; and
   h. providing a human detectable fault signal indication when the number of fault occurrences exceeds said predetermined number in said predetermined time interval.

* * * * *